United States Patent
Fuentes-Hernandez et al.

(10) Patent No.: US 12,150,319 B2
(45) Date of Patent: Nov. 19, 2024

(54) HIGH SENSITIVITY STABLE SENSORS AND METHODS FOR MANUFACTURING SAME

(71) Applicant: Georgia Tech Research Corporation, Atlanta, GA (US)

(72) Inventors: Canek Fuentes-Hernandez, Atlanta, GA (US); Wen-Fang Chou, Atlanta, GA (US); Xiaojia Jia, Atlanta, GA (US); Bernard Kippelen, Atlanta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 576 days.

(21) Appl. No.: 17/429,334

(22) PCT Filed: Feb. 7, 2020

(86) PCT No.: PCT/US2020/017260
§ 371 (c)(1),
(2) Date: Aug. 7, 2021

(87) PCT Pub. No.: WO2020/176223
PCT Pub. Date: Sep. 3, 2020

(65) Prior Publication Data
US 2022/0123240 A1 Apr. 21, 2022

Related U.S. Application Data
(60) Provisional application No. 62/803,360, filed on Feb. 8, 2019.

(51) Int. Cl.
*H10K 30/81* (2023.01)
*H10K 10/46* (2023.01)
*H10K 19/10* (2023.01)

(52) U.S. Cl.
CPC ......... *H10K 10/482* (2023.02); *H10K 10/476* (2023.02); *H10K 19/10* (2023.02)

(58) Field of Classification Search
CPC .............................. H10K 30/80; H10K 30/81
See application file for complete search history.

(56) References Cited

U.S. PATENT DOCUMENTS 6,930,059 B2   8/2005   Conley, Jr. et al.
9,368,737 B2   6/2016   Hwang et al.
(Continued)

FOREIGN PATENT DOCUMENTS

JP   2015023079 A   2/2015
KR   20130129926 A   11/2013

OTHER PUBLICATIONS

International Search Report and Written Opinion dated Nov. 6, 2020 issued in PCT International Application No. PCT/US2020/017260.

*Primary Examiner* — Jae Lee
(74) *Attorney, Agent, or Firm* — Troutman Pepper Hamilton Sanders LLP; Ryan A. Schneider

(57) ABSTRACT

Provided is a semiconductor device having a dual gate field-effect transistor and a sensor in electrical communication with the transistor. The field-effect transistor can have a first gate electrode, a second gate electrode, a source electrode, a drain electrode, a semiconductor layer with parts in contact with the source and drain electrodes, a bi-layer gate insulator, and a second gate insulator. The bi-layer gate insulator can include a first layer and a second layer, the first layer located between the second layer and a first side of the semiconductor layer, the second layer located between the first layer and the first gate electrode. The second gate insulator can be located between the second gate electrode
(Continued)

and a second side of the semiconductor layer, and the sensor can be in electrical communication with the second gate electrode.

22 Claims, 12 Drawing Sheets

(56) References Cited

U.S. PATENT DOCUMENTS

| | | |
|---|---|---|
| 9,546,977 B1 | 1/2017 | DiCarlo et al. |
| 10,043,990 B2 | 8/2018 | Zang et al. |
| 2005/0170667 A1 | 8/2005 | Conley, Jr. et al. |
| 2005/0170668 A1 | 8/2005 | Park et al. |
| 2012/0199821 A1* | 8/2012 | Gwoziecki ............ H10K 10/482 |
| | | 257/E51.025 |
| 2013/0270534 A1 | 10/2013 | Hwang et al. |
| 2014/0042437 A1* | 2/2014 | Yamazaki ......... H01L 29/78693 |
| | | 257/43 |
| 2016/0163762 A1 | 6/2016 | Yamada |
| 2019/0040188 A1* | 2/2019 | Nanson ................. C07D 519/00 |
| 2020/0012369 A1* | 1/2020 | Guo ..................... G06F 3/04144 |
| 2020/0373430 A1* | 11/2020 | Shima ............... G02F 1/133345 |

* cited by examiner

HIGH SENSITIVITY STABLE SENSORS AND METHODS FOR MANUFACTURING SAME

CROSS-REFERENCE TO RELATED APPLICATIONS

This application claims the benefit of U.S. Provisional Application Ser. No. 62/803,360, filed on 8 Feb. 2019, the entire contents and substance of which is incorporated herein by reference in its entirety as if fully set forth below.

STATEMENT OF RIGHTS UNDER FEDERALLY SPONSORED RESEARCH

This invention was made with government support under Grant No. FA9550-16-1 awarded by the Air Force Office of Scientific Research and Grant No. DE-NA0002576 awarded by the Department of Energy. The government has certain rights in the invention.

FIELD OF INVENTION

Examples of the present disclosure relate to systems and methods for high sensitivity stable sensors, and more particularly to systems and methods for high sensitivity photodetectors including an organic dual gate field-effect transistor (DG-OFET) and an organic photodiode (OPD).

BACKGROUND

Over the last several years, organic and mixed transition metal oxide semiconductor channel based field-effect transistors (FETs) have been extensively studied because they can be produced at a very low cost on large areas, and on flexible or free-form substrates. Sensors and or other electronic applications comprised of such FETs are being used in a wide range of applications, including, but not limited to, consumer electronics, health monitoring, security, and internet of things. For many of these applications, it would be desirable to have low-cost flexible large-area sensors having low power consumption and high responsivity in order to measure weak external signals, such as light, ionizing radiation, chemical analytes and many others.

Current sensor technologies are primarily based on crystalline inorganic semiconductors processed at high temperatures into typically rigid-form substrates. The high cost, weight, and power requirements of such technologies remain limitations for their wider use and deployment over large areas. In contrast, organic semiconductors have low processing temperature, are light weight, possess mechanical flexibility, and low manufacturing costs.

A drawback of conventional organic semiconductors is that they suffer from electrical instabilities and reduced responsivity. As an example, organic photodetectors, to date, have been realized in two architectures, OPDs and organic phototransistors (OPTs). OPDs are typically operated in reverse bias in a photoconductor mode. Such operation typically results in broad spectral coverage, low dark current, and short response time. However, a major drawback is that the photoresponsivity is typically limited by a maximum external quantum efficiency (EQE) of 100%. OPTs were developed to combat such limitations. OPTs combined the intrinsic current amplification properties of transistors with the photoconductive properties of semiconductors. Conventional OPTs, however, suffer from reduced speed due to the reliance on trap sights in the active layer for the build-up and decay of light-induced currents.

Accordingly, there is a need for systems and methods for high sensitivity stable sensors having suitable stability, sensitivity, and speed characteristics suitable for use in many commercial applications. Examples of the present disclosure are directed to these and other considerations.

SUMMARY

Examples of the present disclosure comprise systems and methods for high sensitivity stable sensors, and more particularly to systems and methods for high sensitivity photodetectors including an organic dual gate field-effect transistor and an organic photodiode.

Disclosed is an example of a semiconductor device comprising a field-effect transistor and a sensing device. The field-effect transistor comprising a first gate electrode, a second gate electrode, a source electrode, a drain electrode, a semiconductor layer with parts in contact with the source and drain electrodes, a bi-layer gate insulator comprising a first layer and a second layer, the first layer located between the second layer and a first side of the semiconductor layer, the second layer located between the first layer and the first gate electrode, and a second gate insulator located between the second gate electrode and a second side of the semiconductor layer, where the sensor is in electrical communication with the second gate electrode.

In any of the example semiconductor devices disclosed herein the first layer of the bi-layer gate insulator can be positioned adjacent the first side of the semiconductor layer at a first interface, the first layer of the bi-layer gate insulator can comprise a fluoropolymer, the first layer of the bi-layer gate insulator can have a first dielectric constant and a first thickness, and interfacial charge trapping at the first interface can cause a first effect on a current between the drain and the source over time under a continuous bias stress.

In any of the example semiconductor devices disclosed herein the second layer of the bi-layer gate insulator can comprise a nanolaminate layer, the second layer of the bi-layer gate insulator can have a second dielectric constant and a second thickness, the second dielectric constant can be higher than the first dielectric constant, and a change in the polarizability of the second gate insulator layer over time under continuous bias stress can cause a second effect on the current between the drain and the source.

In any of the example semiconductor devices disclosed herein selection of the first and second thickness and the first and second dielectric constant can be such that the first effect compensates at least partly the second effect to provide increased operational stability.

In any of the example semiconductor devices disclosed herein, a variation of a current between the source and the drain electrodes under a continuous bias stress for a period of one hour can be less than 5 percent.

In any of the example semiconductor devices disclosed herein, the sensor can comprise one of a photodiode, a chemical sensor, a biological sensor, a mechanical sensor, or any device that senses an analyte or a physical parameter, and converts it into an electrical signal through a transducer mechanism.

In any of the example semiconductor devices disclosed herein, the electrical potential can vary rapidly in time. In any of the example semiconductor devices disclosed herein, the electrical potential can vary slowly or can be constant in time.

In any of the example semiconductor devices disclosed herein, the semiconductor device can comprise a substrate, and the second gate electrode can be located between the substrate and the second gate insulator.

In any of the example semiconductor devices disclosed herein, the sensor can be located between the second gate electrode and the substrate.

In any of the example semiconductor devices disclosed herein, the second gate electrode can have a first length, the second gate insulator can have a second length, the first length can be greater than the second length, the second gate insulator can be located on a first portion of the bottom gate electrode, and the sensor can be located on a second portion of the bottom gate electrode.

In any of the example semiconductor devices disclosed herein, wherein the first gate electrode can be located between the substrate and the second layer of the bi-layer gate insulator.

In any of the example semiconductor devices disclosed herein, the semiconductor device can be an organic semiconductor device.

In any of the example semiconductor devices disclosed herein, the second gate insulator can comprise aluminum oxide and the second gate insulator can be deposited by atomic layer deposition (ALD).

In any of the example semiconductor devices disclosed herein, the capacitance density of the second gate insulator can be between 10 and 400 nanoFarads per centimeter squared In any of the example semiconductor devices disclosed herein, the thickness of the second gate insulator can be between 10 and 50 nm.

In any of the example semiconductor devices disclosed herein, the second layer of the bi-layer gate insulator can comprise aluminum oxide and an inorganic material selected from the group consisting of $SiN_x$, $TiO_2$, $HfO_2$, $Ta_2O_5$, $SiO_2$, $Y_2O_3$, $ZrO_2$.

Further disclosed is a method for manufacturing semiconductor device, the process including providing a source electrode, providing a drain electrode, providing a first gate electrode, providing a second gate electrode, providing a semiconductor layer with parts in contact with the source and drain electrodes, providing a first gate insulator between the first gate electrode and the semiconductor layer, providing a second gate insulator located between the second gate and a second side of the semiconductor layer, and providing a sensor in electrical communication with the second gate electrode. In some examples, providing the first gate insulator comprises depositing a first layer of the first gate insulator, the first layer comprising a fluoropolymer, wherein the first layer has a first dielectric constant and a first thickness, and depositing a second layer of the first gate insulator, the second layer having a second dielectric constant and a second thickness, the second dielectric constant being higher than the first dielectric constant.

In any of the examples disclosed herein, the first layer of the first gate insulator can define an interface with the semiconductor layer and the depositing the first layer can be such that interfacial charge trapping at the interface causes a first effect on a current between the source and drain electrodes over time under a continuous bias stress, wherein a change in the polarizability of the second layer of the first gate insulator over time under continuous bias stress can cause a second effect on the current between the drain and the source electrodes, and selection of the first and second thicknesses and the first and second dielectric constants can be such that the first effect compensates at least partly the second effect.

In any of the examples disclosed herein, a capacitance density of the second gate insulator can be between 10 and 400 nanoFarads per centimeter squared.

In any of the examples disclosed herein, providing the second gate insulator can comprise depositing the second gate insulator on a first portion of the second gate electrode.

In any of the examples disclosed herein, providing the sensor can comprise disposing the sensor on a second portion of the second gate electrode.

Further features of the disclosed design, and the advantages offered thereby, are explained in greater detail hereinafter with reference to specific examples illustrated in the accompanying drawings, wherein like elements are indicated be like reference designators.

BRIEF DESCRIPTION OF THE DRAWINGS

Reference will now be made to the accompanying drawings, which are not necessarily drawn to scale, are incorporated into, and constitute a portion of, this disclosure, illustrate various implementations and aspects of the disclosed technology and, together with the description, serve to explain the principles of the disclosed technology. In the drawings.

DETAILED DESCRIPTION

Figure 1:
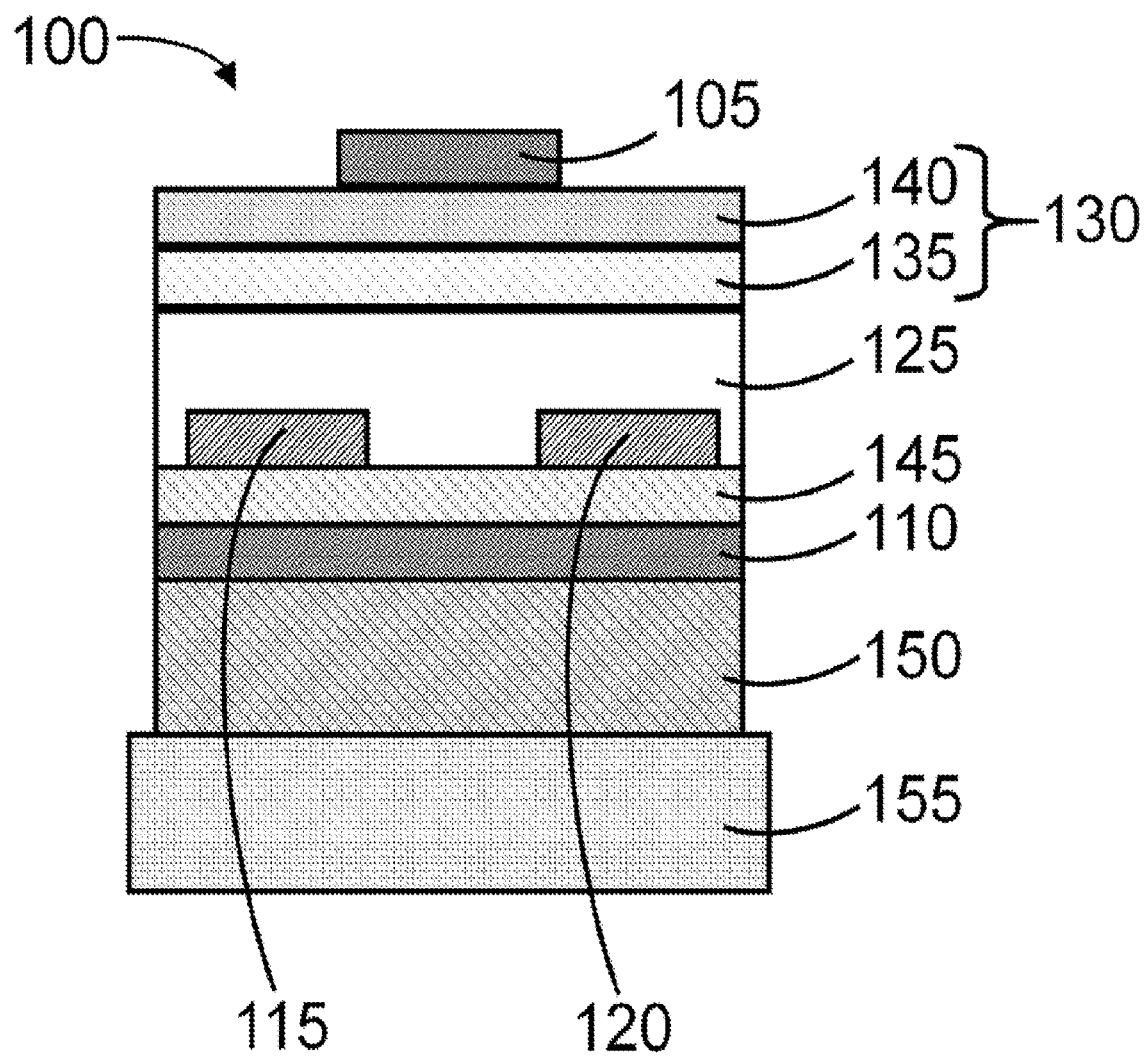
FIG. 1 is a schematic section views of a sensor device having a dual gate field-effect transistor and a photodiode disposed in a vertical structure, in accordance with an example of the present disclosure.

Examples of the present disclosure relate to systems and methods for high sensitivity stable sensors, and more particularly to systems and methods for high sensitivity sensors including a dual gate field-effect transistor and a sensing device. Throughout, much of the discussion herein is directed towards high sensitivity photodetectors including an organic dual gate field-effect transistor (DG-OFET) and an organic photodiode (OPD), however as will be appreciated by one of ordinary skill in light of the present disclosure, the sensing device may be any device that senses an analyte or a physical parameter, and outputs, in response, an electrical potential.

As will be appreciated, the high sensitivity sensors disclosed provide a useful way for sensing small quantities of an analyte, or a small input signal. For example, the electrical potential produced by the sensing device may be applied to the bottom gate of the dual gate field-effect transistor, which results in a change in the operating point of the transistor. As will be appreciated, the change in the operating point change leads to amplification in the current flowing between the drain and source electrodes which can be easily measured, thus allowing for the detection and measurement of small input signals.

Further, the high sensitivity sensors disclosed provide for both real time and over time signal detection. As will be appreciated, the amplified current flowing between the drain and source electrodes as a result of the applied electrical potential from the sensing device is based on generated electrical carriers. These carriers can be either transient or trapped. The transient carriers will result in instantaneous or real time increases in the flowing between the drain and source electrodes that can be measured and that typically reduces once the electric potential is removed. The measurement of such transient carriers is useful in devices and applications requiring sufficiently fast response times such as photodetection devices and applications. The trapped carriers, however, will result in cumulative increases to the operating current of the semiconductor device over time, which can also be measured. The measurement of such trapped carriers is useful in devices and applications interested in measuring cumulative effects of exposure to signals, such as radiation and/or other chemical sensing devices for dosimetry and applications.

Some implementations of the disclosed technology will be described more fully with reference to the accompanying drawings. This disclosed technology, however, may be embodied in many different forms and should not be construed as limited to the implementations set forth herein. The components described hereinafter as making up various elements of the disclosed technology are intended to be illustrative and not restrictive. Many suitable components that could perform the same or similar functions as components described herein are intended to be embraced within the scope of the disclosed systems and methods. Such other components not described herein may include, but are not limited to, for example, components developed after development of the disclosed technology.

It is also to be understood that the mention of one or more method steps does not imply a particular order of operation or preclude the presence of additional method steps or intervening method steps between those steps expressly identified. Similarly, it is also to be understood that the mention of one or more components in a device or system does not preclude the presence of additional components or intervening components between those components expressly identified.

Reference will now be made in detail to example examples of the disclosed technology, examples of which are illustrated in the accompanying drawings and disclosed herein. Wherever convenient, the same references numbers will be used throughout the drawings to refer to the same or like parts.

FIG. 1 illustrates an example of a sensor device 100 having a dual gate field-effect transistor and a vertical geometric structure. The illustrated device 100 comprises a first gate electrode 105, a second gate electrode 110, a source electrode 115, a drain electrode 120, a semiconductor layer 125 with parts in contact with the source electrode 115 and the drain electrode 120, a bi-layer gate insulator 130 comprising a first layer 135 and a second layer 140, a second gate insulator 145 located between the second gate electrode 110 and a second side of the semiconductor layer 125, a sensor 150 in electrical communication with the second gate electrode 110 and a substrate 155 in contact with the sensor 150. As depicted, the first gate electrode 105 is a top gate electrode and the second gate electrode 110 is a top gate electrode. In other examples, the sensor device 100 can have a vertical geometry in which the first gate electrode 105 is a bottom gate electrode in contact with the substrate 155 and the second gate electrode 110 is a top gate electrode.

As shown the sensing device 150 is in contact with the bottom gate electrode 110. When the sensing device 150 senses an analyte or a physical parameter (e.g., light, chemicals, radiation, mechanical input, etc.), it can output, in response, an electrical potential to the bottom gate electrode 110. The applied potential to the bottom gate electrode across the second gate insulator 145 of the dual gate field-effect transistor of the sensor device 100 results in a change in the operating point of the transistor. As will be appreciated, the change in the operating point change leads to amplification in the current flowing between the source electrode 115 and drain electrode 120 which can be easily measured, thus allowing for the detection and measurement of small input signals.

Further, the high sensitivity sensors disclosed provide for both real time and over time signal detection. As will be appreciated, the amplified in the current flowing between the source electrode 115 and drain electrode 120 as a result of the applied electrical potential from the sensing device 150 is based on electrical carriers generated in the sensor device 150. These carriers can be either transient or trapped. The transient carriers will result in instantaneous or real time increases or decreases in the flowing between the source electrode 115 and drain electrode 120 that can be measured and that typically reduces or increases once the electric potential is removed (e.g., input signal applied to sensing device 150 is removed). The measurement of such transient carriers is useful in devices and applications requiring sufficiently high response times such as photodetection devices and applications. The trapped carriers, however, will result in cumulative increases to the operating current of the sensing device over time, which can also be measured. The measurement of such trapped carriers is useful in devices and applications interested in measuring cumulative effects of exposure to signals, such as radiation and/or other chemical sensing devices for dosimetry and applications.

As further depicted in FIG. 1, the source electrode 115 and drain electrode 120 are typically patterned on the second gate insulator 110, and the layer of semiconductor material 125 is deposited over the source electrode 115 and drain electrode 120. The second gate insulator layer 145 and the bi-layer gate insulator 130 are typically disposed on opposite sides of the semiconductor layer 125. The first gate electrode 105 is typically patterned on the bi-layer gate insulator 130. Note that the top gate structure could be staggered (as illustrated in FIG. 1) or coplanar where the source electrode 115 and drain electrode 120 touch the bi-layer gate insulator 130. The top gate metal electrode 105 is typically patterned on the bi-layer gate insulator 130.

As previously mentioned, the bi-layer gate insulator 130 comprises first layer 135 and a second layer 140. The bi-layer gate insulator 130 may be a bi-layer gate insulator such as that described in U.S. Pat. No. 9,369,737 titled, "Multi-Layer Gate Dielectric Field-Effect Transistor and Manufacturing Process Thereof," the entire contents of which are herein incorporated by reference. The materials for bilayer gate insulator 130 are selected such that each layer (e.g., first layer 135 and second layer 140) undergo two aging mechanisms that are compensating over time such that the stability is maintained over time.

For example, the first layer 135 can be formed from a first material, such as, for example, an amorphous fluoropolymer, having a first dielectric constant and a first thickness. As depicted in FIG. 1, the first layer 135 can contact the semiconductor layer 125. The interface between the first layer 135 and the semiconductor layer 125 comprises a plurality of traps causing a first effect on a current between the source electrode 115 and drain electrode 120 over time under continuous bias stress. The second layer 140 can be formed from a second material, such as, for example, a typically a high-k dielectric having a second dielectric constant and a second thickness. The second dielectric constant can be higher than the first dielectric constant. The first dielectric constant can smaller than 3, and the first thickness can be smaller than 200 nm. The second dielectric constant can be higher than 5 and the second thickness can be smaller than 200 nm. In a preferred embodiment the second thickness can be smaller than 100 nm. In another embodiment, the second thickness can be less than 50 nm. The second layer 140 can be arranged such that said second dielectric constant increases over time under continuous bias stress causing a second effect on the current between the source electrode 115 and drain electrode 120 over time under continuous bias stress.

The first and second thickness and the first and second dielectric constant are such that said first effect compensates at least partly said second effect such that the stability of the transistor is maintained over time. For example, the variation of the current between the source electrode 115 and drain electrode 120 over time under continuous bias stress remains within a limited range. In an example embodiment, the variation of the current between the source electrode 115 and drain electrode 120 under continuous bias stress (wherein the drain and gate voltage with respect to the source voltage are at least 0.5V above the threshold voltage, i.e. $|V_G|$, $|V_D|>|V_{th}|+0.5V$) for 1 hour is less than 5 percent, preferably less than 3 percent. More preferably this variation is less than 5 percent, preferably less than 3 percent, for 2 hours.

The use of an amorphous fluoropolymer/high-k oxide bi-layer 130 combines the good chemical properties of amorphous fluoropolymer with the high film quality and large capacitance density of high-k oxides. In addition, for the top gate geometry, this bi-layer gate dielectric also has better encapsulation properties against environmental exposure than a single layer amorphous fluoropolymer.

The material of the first layer 135 can e.g. be any one of the following materials: a copolymer of fluorinated 1,3-dioxole and tetrafluoroethylene (TFE), such as a copolymer of 4,5-difluoro-2,2-bis(trifluoromethyl)-1,3-dioxole (PDD) and tetrafluoroethylene (TFE) or a copolymer of 2,2,4-trifluoro-5-trifluoromethoxy-1,3-dioxole (TTD) and tetrafluoroethylene (TFE); a copolymer of perfluorofuran (PFF) and tetrafluoroethylene (TFE); a homo- or copolymer of perfluoro(4-vinyloxy)-1-alkenes. The first layer 135 can e.g. be deposited from a formulation with the fluoropolymer and one or more fluoro-solvents by any one of the following printing or coating techniques: spin coating, doctor blading, wire bar coating, spray or dip coating, ink jet printing, gravure printing, flexo printing, or any other known suitable method.

The dielectric material of the second layer 140 is preferably a high-k inorganic dielectric and can be any one or a combination of the following materials: $Al_2O_3$, $SiN_x$, $TiO_2$, $HfO_2$, $Ta_2O_5$, $SiO_2$, $Y_2O_3$, $ZrO_2$, any other suitable materials. Alternatively, the second layer 140 can be formed from an organic material, and for example any one of the following materials: polymers comprising orientable and/or inducible dipoles or a polymer matrix doped with molecules with permanent dipoles. The second layer 140 can e.g. be deposited by any one of the following techniques: atomic layer deposition (ALD), electron beam deposition, RF-sputtering or plasma-enhanced chemical vapor deposition, pulsed laser deposition (PLD), or any other known suitable technique. In one example, the second layer 140 can be an $Al_2O_3$ layer deposited by ALD. Further, the second layer 140 can be a nanolaminate layer. For example, the second layer 140 can be a nanolaminate layer comprising alternating sub layers of $HfO_2$ and $Al_2O_3$.

The semiconductor layer 125 can be either an organic or an inorganic semiconductor layer. An example of an organic layer is a TIPS-pentacene and Poly (triarylamine) (PTAA) layer, a pentacene layer, a rubrene layer, a TIPS-pentacene and $PC_{60}BM$ layer. Such a layer may e.g. be applied by spin-coating or any suitable printing or coating technique, by physical vapor deposition, by organic vapor phase deposition, or any other known vacuum deposition method. An example of an inorganic layer is a transition metal oxide such as an InGaZnO, ZnO, InZnO, GaZnO, $In_2O_3$, or any other know suitable semiconductor including amorphous silicon and poly-silicon.

The dielectric material of the second gate insulator layer 145 is preferably a high-k inorganic dielectric and can be any one of the following materials: $Al_2O_3$, $SiN_x$, $TiO_2$, $HfO_2$, $Ta_2O_5$, $SiO_2$, $Y_2O_3$, $ZrO_2$, any other suitable materials. The second gate insulator layer 145 can have capacitance density ranges between 10 and 400 nanoFarad per square centimeter. The first gate insulator layer 130 can have capacitance density ranges greater than 30 nanoFarad per square centimeter. The second gate insulator layer 145 can be deposited by any one of the following techniques: atomic layer deposition (ALD), electron beam deposition, RF-sputtering or plasma-enhanced chemical vapor deposition, pulsed laser deposition (PLD), or any other known suitable technique. In one example, the second gate insulator layer 145 can be an $Al_2O_3$ layer deposited by ALD. The second gate insulator layer 145 can have a thickness between 10 nanometers and 50 nanometers. In one example, the second gate insulator layer 145 can have a thickness of 10 nanometers.

The substrate 155 can be a rigid or flexible such as rigid glass, flexible glass, Si wafer, PET, PES, PEN, Polyimide, paper, metal foil substrates.

Figure 2:
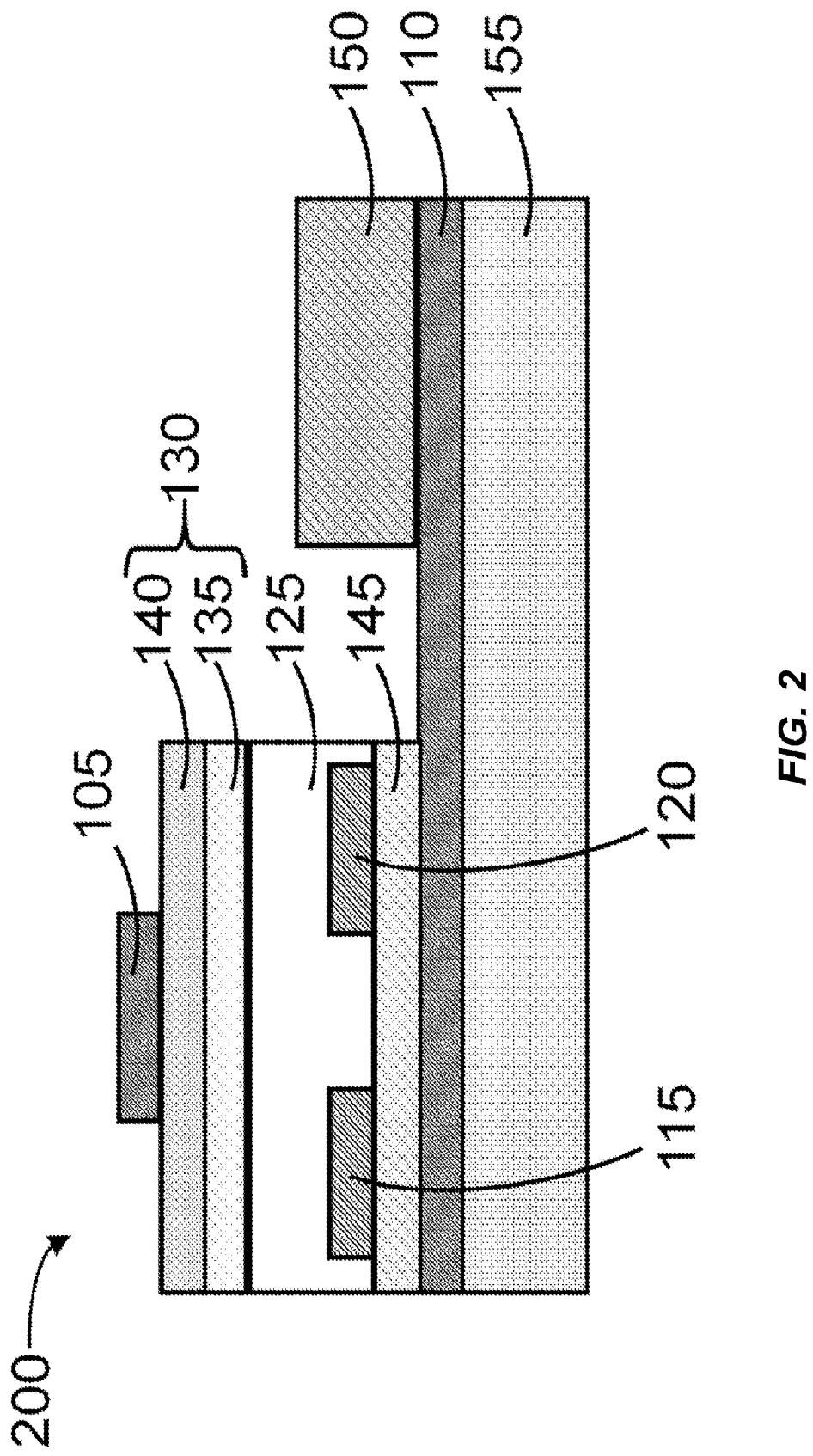
FIG. 2 is a schematic section views of a sensor device having a dual gate field-effect transistor and a photodiode disposed in a lateral structure, in accordance with an example of the present disclosure.

FIG. 2 illustrates an example of a sensor device 200 being similar to having a dual gate field-effect transistor similar to that of sensor device 100, however sensor device 200 includes a lateral geometric structure. The illustrated device 200 comprises a first gate electrode 105, a second gate electrode 110, a source electrode 115, a drain electrode 120, a semiconductor layer 125 with parts in contact with the source electrode 115 and the drain electrode 120, a bi-layer gate insulator 130 comprising a first layer 135 and a second layer 140, a second gate insulator 145 located between the second gate electrode 110 and a second side of the semiconductor layer 125, a sensor 150 in electrical communication with at least a portion of the second gate electrode 110 and a substrate 155 in contact with the second gate electrode 110. As further depicted, the sensing device 155 can be in contact with a first portion of the bottom gate electrode 110 and the second gate insulator layer 145 can be in contact with a second portion of the bottom gate electrode 110. Further, the sensing device 155 can be laterally disposed with relation to the semiconductor layer 125.

Figure 3:
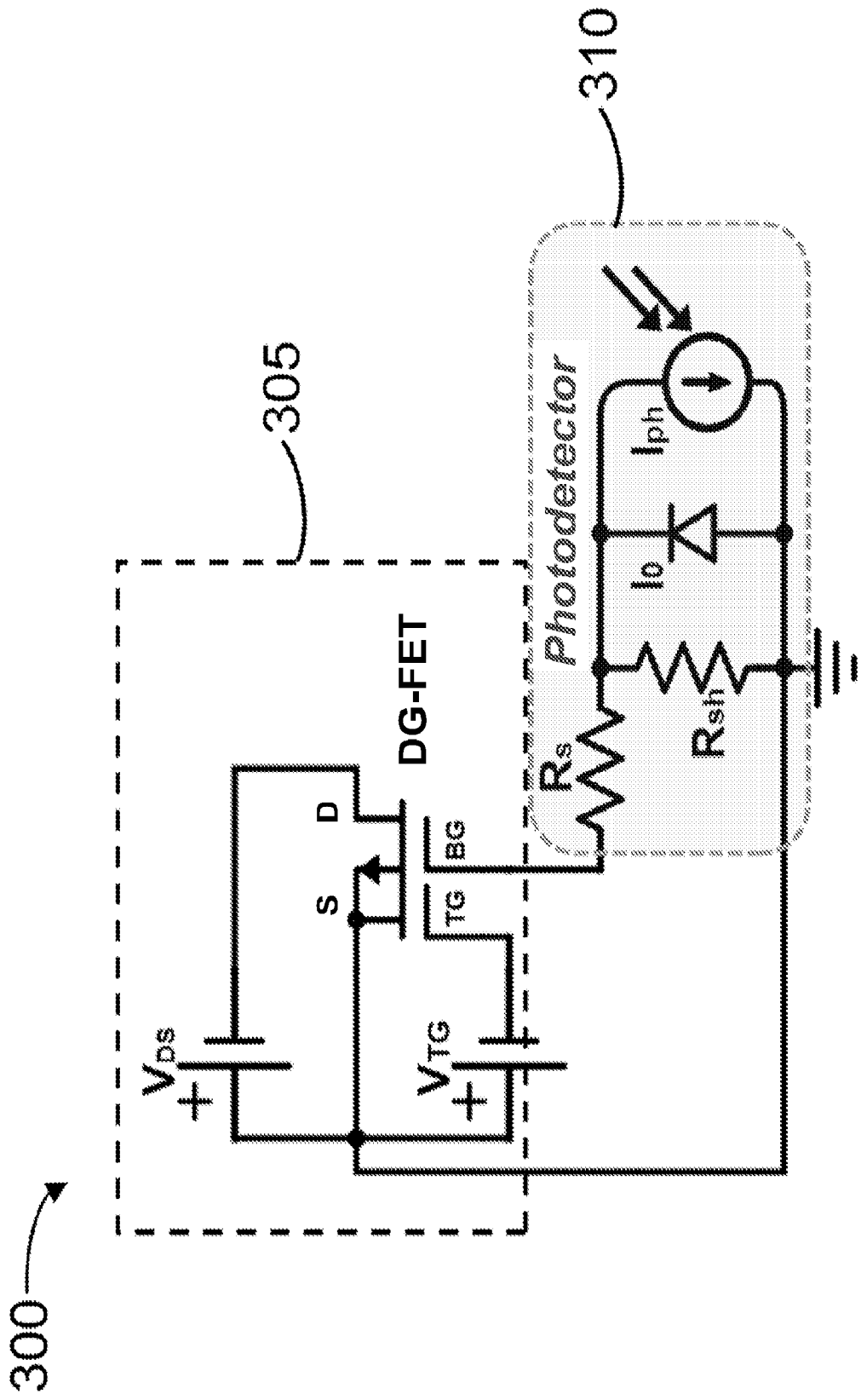
FIG. 3 is a circuit configuration of the sensor devices depicted in FIGS. 1 and 2, in accordance with an example of the present disclosure.

FIG. 3 depicts a circuit configuration of the sensor devices 100, 200 depicted in FIGS. 1 and 2, in accordance with an example of the present disclosure. As shown, the circuit includes a dual-gate field-effect transistor (DG-FET) 305 and a photodetector (PD) 310 in electrical communication. The output of the OPD 310 can be in electrical communication with the second gate (depicted in FIG. 3 as BG) of the DG-FET 305. When the PD 310 senses light, it can output, in response, an electrical potential (e.g., a voltage) to the bottom gate of the DG-FET 305. The applied potential to the bottom gate of the DG-OFET 305 results in a change in the operating point of the DG-OFET 305. As will be appreciated, the change in the operating point change leads to amplification in the current flowing between the source electrode (depicted in FIG. 3 as S) and drain electrode (depicted in FIG. 3 as D) which can be easily measured, thus allowing for the detection and measurement of small light input.

Figure 4:
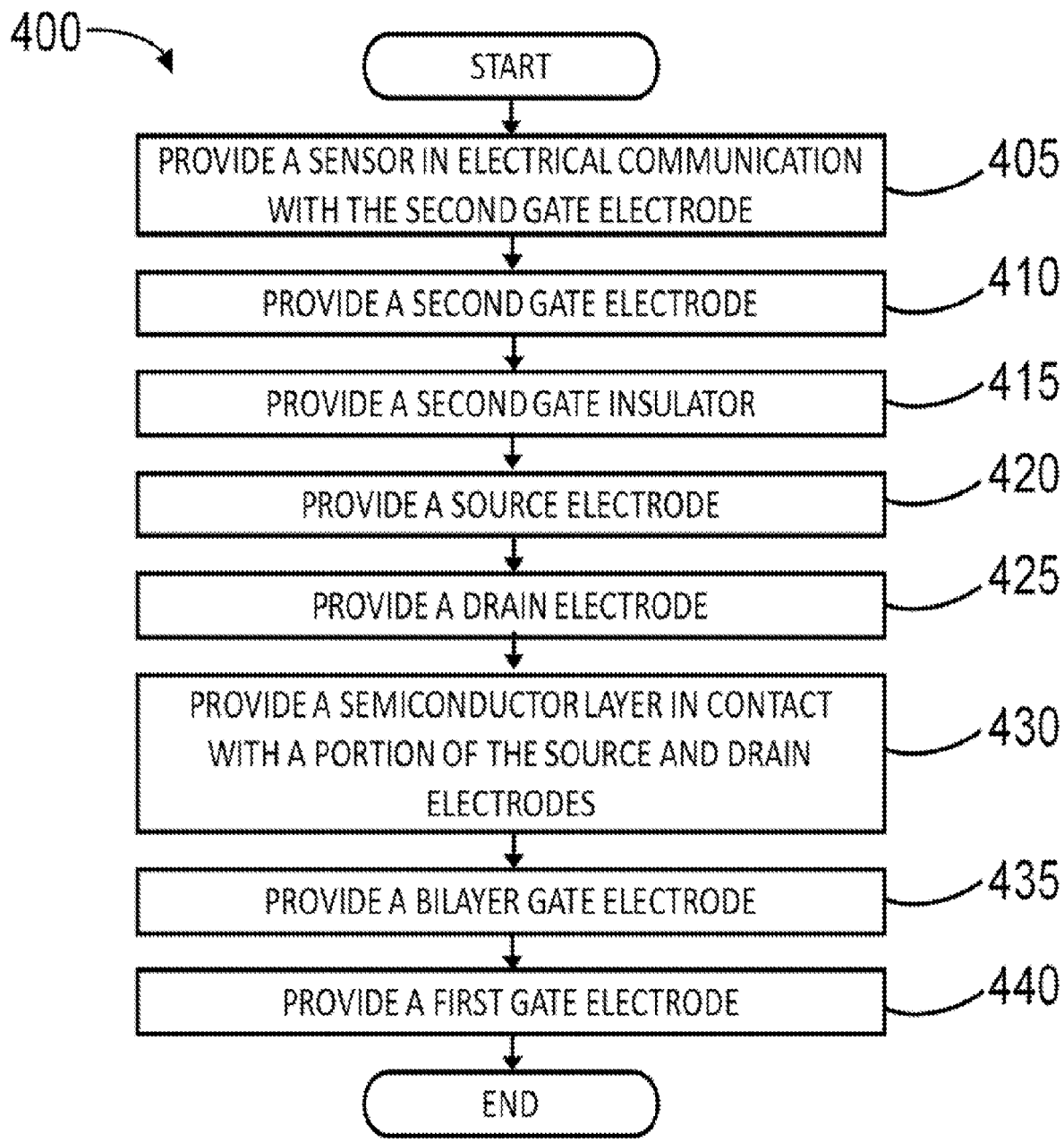
FIG. 4 is a flowchart of a method for manufacturing a sensor device, in accordance with an example of the present disclosure.

FIG. 4 is a flowchart of a method 400 for manufacturing a sensor device, in accordance with an example of the present disclosure. As depicted, the method 400 begins at 405 with providing a sensor or sensing device in electrical communication with the second gate electrode. For example, a sensing device can be in physical contact with the second gate electrode such that when the sensing device senses an analyte or a physical parameter (e.g., light, chemicals, radiation, mechanical input, etc.), it can output, in response, an electrical potential to the second gate electrode.

At 410 a second gate electrode 110 is provided. Electrodes, such as the second gate electrode can be made of various conductive materials, such as for example, copper, graphite, titanium, brass, silver, platinum and PEDOT:PSS. Electrodes, such as the second gate electrode 110 can be in contact with a sensor 150, as depicted in FIG. 1, or in contact with substrate on second surface and with at least a portion of a sensor 150 on a first surface as depicted in FIG. 2.

At 415 a second gate insulator later 145 is provided in contact with the second gate electrode 110 as depicted in FIG. 1 or with at least a portion of the second gate electrode 110 as depicted in FIG. 2. The dielectric material of the second gate insulator layer 145 can be a high-k inorganic dielectric and can be any one of the following materials: $Al_2O_3$, $SiN_X$, $TiO_2$, $HfO_2$, $Ta_2O_5$, $SiO_2$, $Y_2O_3$, $ZrO_2$, any other suitable materials. The second gate insulator layer 145 can have capacitance density ranges between 10 and 400 nanoFarad per square centimeter. The second gate insulator layer can be deposited by any one of the following techniques: atomic layer deposition (ALD), electron beam deposition, RF-sputtering or plasma-enhanced chemical vapor deposition, pulsed laser deposition (PLD), or any other known suitable technique. In one example, the second gate insulator layer can be an $Al_2O_3$ layer deposited by ALD. The second gate insulator layer can have a thickness between 10 nanometers and 50 nanometers. In one example, the second gate insulator layer can have a thickness of 50 nanometers.

At 420 a source electrode 115 is provided. The method 400 further comprises, at 425, providing a drain electrode 120. Electrodes, such as the source electrode and drain electrodes can be made of various conductive materials, such as for example, copper, graphite, titanium, brass, silver, and platinum. Electrodes, such as the source electrode 115 and drain electrode 120 can be patterned on a semiconductor layer 125 or as depicted in FIGS. 1 and 2, can be patterned on the second gate insulator 145, and the layer of semiconductor material 125 can be deposited over the source electrode 115 and drain electrode 120.

At 430, a semiconductor layer 125 is provided in contact with a portion of the source 115 and drain 120 electrodes. Semiconductor layers can be either an organic or an inorganic semiconductor layer. An example of an organic layer is a TIPS-pentacene and Poly (triarylamine) (PTAA) layer, a pentacene layer, a rubrene layer, a TIPS-pentacene and $PC_{60}BM$ layer. Such a layer may e.g. be applied by spin-coating or any suitable printing or coating technique, by physical vapor deposition, by organic vapor phase deposition, or any other known vacuum deposition method. An example of an inorganic layer is a transition metal oxide such as an InGaZnO, ZnO, InZnO, GaZnO, $In_2O_3$, or any other know suitable semiconductor including amorphous silicon and poly-silicon.

At 435, a first gate insulator layer 130 is provided between the first gate electrode 105 and the semiconductor layer 125. The first gate insulator layer can be bi-layer gate having a first layer 135 and a second layer 140. The materials for bilayer gate insulator can be selected such that each layer (e.g., first layer and second layer) undergo two aging mechanisms that are compensating over time such that the stability is maintained over time. The material of the first layer 135 can be any one of the following materials: a copolymer of fluorinated 1,3-dioxole and tetrafluoroethylene (TFE), such as a copolymer of 4,5-difluoro-2,2-bis(trifluoromethyl)-1,3-dioxole (PDD) and tetrafluoroethylene (TFE) or a copolymer of 2,2,4-trifluoro-5-trifluoromethoxy-1,3-dioxole (TTD) and tetrafluoroethylene (TFE); a copolymer of perfluorofuran (PFF) and tetrafluoroethylene (TFE); a homo- or copolymer of perfluoro(4-vinyloxyl)-1-alkenes. The first layer 135 can be deposited from a formulation with the fluoropolymer and one or more fluoro-solvents by any one of the following printing or coating techniques: spin coating, doctor blading, wire bar coating, spray or dip coating, ink jet printing, gravure printing, flexo printing, or any other known suitable method.

The dielectric material of the second layer 140 is preferably a high-k inorganic dielectric and can be any one of the following materials: $Al_2O_3$, $SiN_X$, $TiO_2$, $HfO_2$, $Ta_2O_5$, $SiO_2$, $Y_2O_3$, $ZrO_2$, any other suitable materials. Alternatively, the second layer 140 can be formed from an organic material, and for example any one of the following materials: polymers comprising orientable and/or inducible dipoles or a polymer matrix doped with molecules with permanent dipoles. The second layer can be deposited by any one of the following techniques: atomic layer deposition (ALD), electron beam deposition, RF-sputtering or plasma-enhanced chemical vapor deposition, pulsed laser deposition (PLD), or any other known suitable technique. In one example, the second layer can be an $Al_2O_3$ layer deposited by ALD. Further, the second layer can be a nanolaminate layer. For example, the second layer 140 can be a nanolaminate layer comprising alternating sub layers of $HfO_2$ and $Al_2O_3$.

At 440, a first gate electrode 105 is provided. Electrodes, such as the first gate electrode can be made of various conductive materials, such as for example, copper, graphite, titanium, brass, silver, platinum and PEDOT:PSS. Electrodes, such as the first gate electrode can be patterned on a first gate insulator layer or on a substrate. For example, the first gate electrode 105, as depicted in FIGS. 1 and 2, can be patterned on first gate insulator layer 130.

Figure 5:
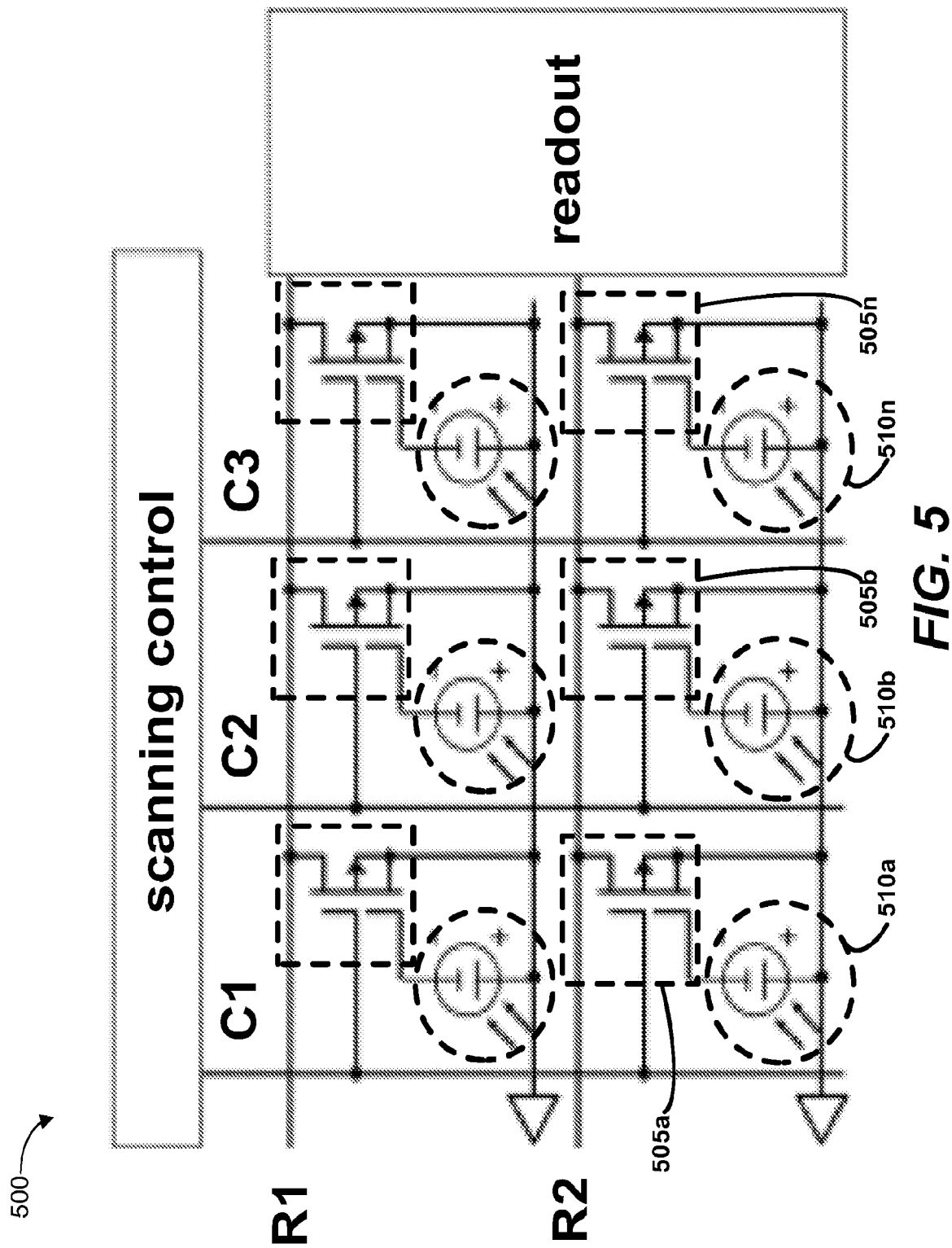
FIG. 5 depicts a circuit schematic for a pixel array, in accordance with an example of the present disclosure.

FIG. 5 depicts a circuit schematic for a pixel array 500, in accordance with an example of the present disclosure. As shown, pixel array 500 can comprise a plurality of dual gate field-effect transistors 505a-505n and a plurality of photodetectors 510a-510n. The electric potential generated by each of the plurality of photodetectors 510a-510n can be applied to one of the gate electrodes of a respective dual gate field-effect transistor 505a-505n, which as previously discussed, can modulate the channel current flow from the drain to the source. The pixel array can be addressable by the remaining gate electrode of the respective dual gate field-effect transistors 505a-505n in order to control pixel detection. For example, a pixel detector can determine an on or off setting based on reading the output of the drain electrodes. The nature of the sensors described through the disclosure (e.g., sensors 100, 200) can allow for scaling of such devices through currently available mass production techniques, such as large-scale printing. As will be appreciated by one of ordinary skill, the scalability of such devices allows for low-cost, low-energy, high-performance ubiquitous large-area imaging arrays.

The specific configurations, machines, and the size and shape of various elements can be varied according to particular design specifications or constraints requiring sensors 100, 200 other components described herein or method 400 constructed according to the principles of this disclosure. Such changes are intended to be embraced within the scope of this disclosure. The presently disclosed examples, therefore, are considered in all respects to be illustrative and not restrictive. The scope of the disclosure is indicated by the appended claims, rather than the foregoing description, and all changes that come within the meaning and range of equivalents thereof are intended to be embraced therein.

As used in this application, the terms "component," "module," "system," "server," "processor," "memory," and the like are intended to include one or more computer-related units, such as but not limited to hardware, firmware, a combination of hardware and software, software, or software in execution. For example, a component may be, but is not limited to being, a process running on a processor, an object, an executable, a thread of execution, a program, and/or a computer. By way of illustration, both an application running on a computing device and the computing device can be a component. One or more components can reside within a process and/or thread of execution and a component may be localized on one computer and/or distributed between two or more computers. In addition, these components can execute from various computer readable media having various data structures stored thereon. The components may communicate by way of local and/or remote processes such as in accordance with a signal having one or more data packets, such as data from one component interacting with another component in a local system, distributed system, and/or across a network such as the Internet with other systems by way of the signal.

Certain examples and implementations of the disclosed technology are described above with reference to block and flow diagrams of systems and methods and/or computer program products according to example examples or implementations of the disclosed technology. It will be understood that one or more blocks of the block diagrams and flow diagrams, and combinations of blocks in the block diagrams and flow diagrams, respectively, can be implemented by computer-executable program instructions. Likewise, some blocks of the block diagrams and flow diagrams may not necessarily need to be performed in the order presented, may be repeated, or may not necessarily need to be performed at all, according to some examples or implementations of the disclosed technology.

These computer-executable program instructions may be loaded onto a general-purpose computer, a special-purpose computer, a processor, or other programmable data processing apparatus to produce a particular machine, such that the instructions that execute on the computer, processor, or other programmable data processing apparatus create means for implementing one or more functions specified in the flow diagram block or blocks. These computer program instructions may also be stored in a computer-readable memory that can direct a computer or other programmable data processing apparatus to function in a particular manner, such that the instructions stored in the computer-readable memory produce an article of manufacture including instruction means that implement one or more functions specified in the flow diagram block or blocks.

As an example, examples or implementations of the disclosed technology may provide for a computer program product, including a computer-usable medium having a computer-readable program code or program instructions embodied therein, said computer-readable program code adapted to be executed to implement one or more functions specified in the flow diagram block or blocks. Likewise, the computer program instructions may be loaded onto a computer or other programmable data processing apparatus to cause a series of operational elements or steps to be performed on the computer or other programmable apparatus to produce a computer-implemented process such that the instructions that execute on the computer or other programmable apparatus provide elements or steps for implementing the functions specified in the flow diagram block or blocks.

Accordingly, blocks of the block diagrams and flow diagrams support combinations of means for performing the specified functions, combinations of elements or steps for performing the specified functions, and program instruction means for performing the specified functions. It will also be understood that each block of the block diagrams and flow diagrams, and combinations of blocks in the block diagrams and flow diagrams, can be implemented by special-purpose, hardware-based computer systems that perform the specified functions, elements or steps, or combinations of special-purpose hardware and computer instructions.

Certain implementations of the disclosed technology are described above with reference to user devices may include mobile computing devices. Those skilled in the art recognize that there are several categories of mobile devices, generally known as portable computing devices that can run on batteries but are not usually classified as laptops. For example, mobile devices can include, but are not limited to portable computers, tablet PCs, internet tablets, PDAs, ultramobile PCs (UMPCs), wearable devices, and smart phones. Additionally, implementations of the disclosed technology can be utilized with internet of things (IoT) devices, smart televisions and media devices, appliances, automobiles, toys, and voice command devices, along with peripherals that interface with these devices.

In this description, numerous specific details have been set forth. It is to be understood, however, that implementations of the disclosed technology may be practiced without these specific details. In other instances, well-known methods, structures, and techniques have not been shown in detail in order not to obscure an understanding of this description. References to "one embodiment," "an embodiment," "some examples," "example embodiment," "various examples," "one implementation," "an implementation," "example implementation," "various implementations," "some implementations," etc., indicate that the implementation(s) of the disclosed technology so described may include a particular feature, structure, or characteristic, but not every implementation necessarily includes the particular feature, structure, or characteristic. Further, repeated use of the phrase "in one implementation" does not necessarily refer to the same implementation, although it may.

Throughout the specification and the claims, the following terms take at least the meanings explicitly associated herein, unless the context clearly dictates otherwise. The term "connected" means that one function, feature, structure, or characteristic is directly joined to or in communication with another function, feature, structure, or characteristic. The term "coupled" means that one function, feature, structure, or characteristic is directly or indirectly joined to or in communication with another function, feature, structure, or characteristic. The term "or" is intended to mean an inclusive "or." Further, the terms "a," "an," and "the" are intended to mean one or more unless specified otherwise or clear from the context to be directed to a singular form. By "comprising," "containing," or "including" it is meant that at least the named element, or method step is present in article or method, but does not exclude the presence of other elements or method steps, even if the other such elements or method steps have the same function as what is named.

As used herein, unless otherwise specified the use of the ordinal adjectives "first," "second," "third," etc., to describe a common object, merely indicate that different instances of like objects are being referred to, and are not intended to imply that the objects so described must be in a given sequence, either temporally, spatially, in ranking, or in any other manner.

While certain examples of this disclosure have been described in connection with what is presently considered to be the most practical and various examples, it is to be understood that this disclosure is not to be limited to the disclosed examples, but on the contrary, is intended to cover various modifications and equivalent arrangements included within the scope of the appended claims. Although specific terms are employed herein, they are used in a generic and descriptive sense only and not for purposes of limitation.

This written description uses examples to disclose certain examples of the technology and also to enable any person skilled in the art to practice certain examples of this technology, including making and using any apparatuses or systems and performing any incorporated methods. The patentable scope of certain examples of the technology is defined in the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

Example Use Cases

The following example use cases describe an example of a use of the systems and methods for high sensitivity stable sensors described herein. They are intended solely for explanatory purposes and not to limit the disclosure in any way.

Figure 6A:
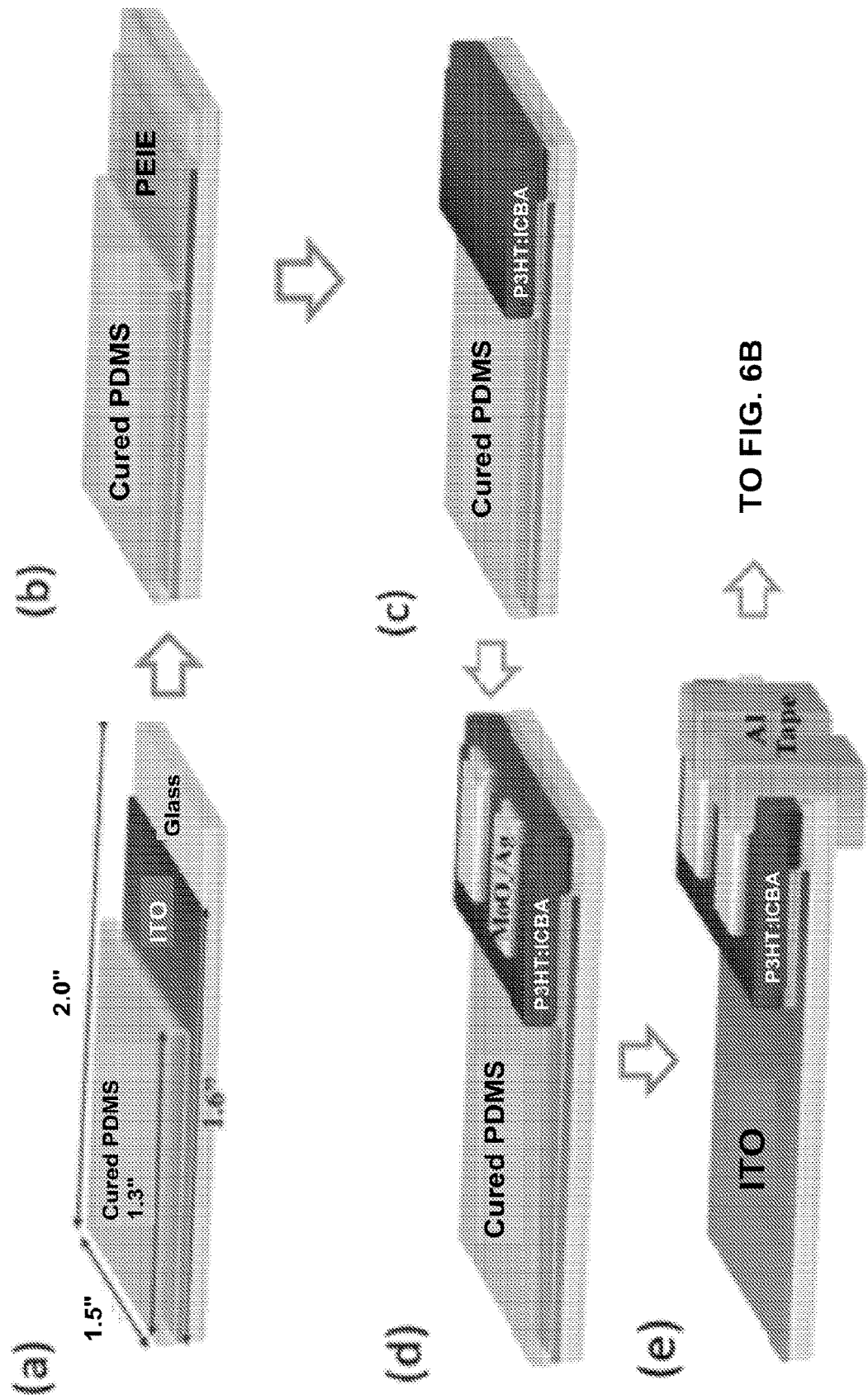
FIGS. 6A and 6B depicts the fabrication process of an example sensor, in accordance with an example of the present disclosure.
Figure 6B:
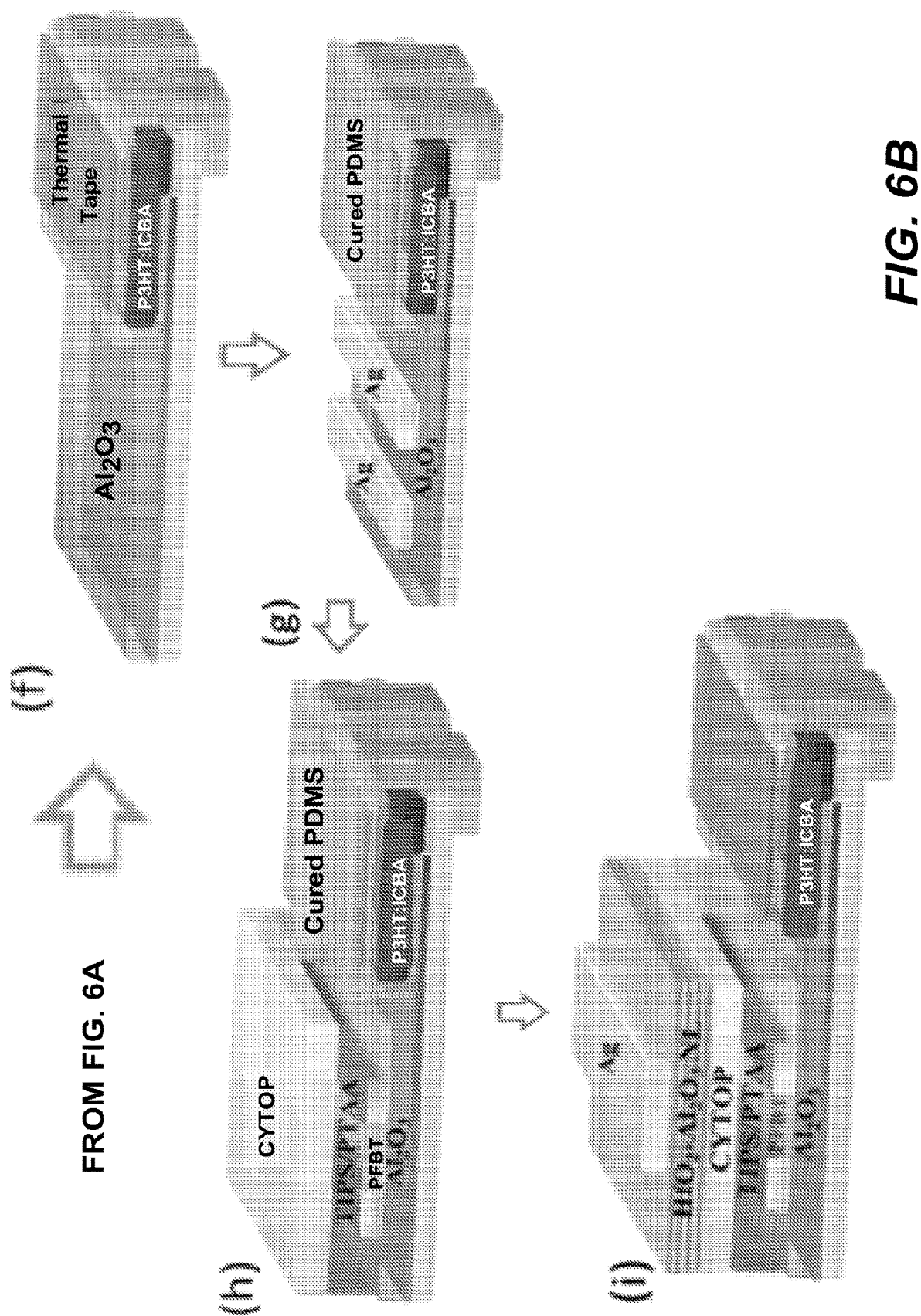

FIG. 6 depicts the fabrication process of the sensor device depicted in FIG. 2, in accordance with an example of the present disclosure. As shown in step (a), ITO was patterned on a substrate and a field-effect transistor area was masked by cured polydimethylsiloxane (PDMS). For example, an ITO-coated glass substrate with sheet resistance of 9-15 Ω was cut into 1.5"×2" pieces and the pieces were masked and patterned via wet etching with a 3:1 volume ration of HNO3:HCL solution for 8 minutes at a bath temperature of 60° C. After etching, the pieces were rinsed with distilled water and scrubbed with a detergent. Then the pieces were solvent cleaned in sequential ultrasonic baths of deionized water, acetone, and 2-propanol at a temperature of 65° C. for at least 30 minutes for each step. To fabricate the PDMS masks, a solution of 1:1 weight ration of the base and agent was gently poured onto a flat glass mold without any trapped air and then cured at 80° C. for one hour under atmospheric pressure. After cooling down the PDMS was peeled off and cut into the size of 1.5"×1.3" and 1.5"×0.7" to cover the OFET and OPD areas, respectively.

As shown in (b) of FIG. 6, polyethylenimine ethoxylated ("PEIE") was spun coating on the OPD area. For example, during the fabrication of the OPD, the OFET area was covered with the PDMS mask. Then a 0.4 wt % PEIE solution was prepared in 2-methoxyethanol and spun on each of the substrates at 5000 rpm with 928 rpm acceleration for 60 seconds through a 0.2 um polytetrafluoroethylene ("PTFE") filter, followed by thermal annealing on a hot plate at 100° C. for 10 minutes in air. The PEW-coated ITO substrates were then transferred into a N2-filled glovebox for further processing.

As shown in (c) of FIG. 6, Poly3-hexylthiophene-2.5-diyl (PH3T) solution was dissolved and prepared with indene-C60 bisadduct (ICBA) and the P3HT:ICBA was spun on top of the PETE coated substrates at 800 rpm with 10,00 rpm s$^{-1}$ acceleration for 30 s. coating of PETE. As shown in (d) of FIG. 6, $MoO_x$ and Ag were deposited as OPD top electrodes onto the P3HT:ICBA layer. As shown in (e) of FIG. 6, the PDMS mask was removed and OPD top electrodes were extended with aluminum tape.

As shown in (f) of FIG. 6, $Al_2O_3$ was deposited as bottom gate dielectric of OFET and OPD was encapsulated with thermal tape. As shown in (g) of FIG. 6, Ag was deposited as OFET source and drain electrodes and OPD area was masked by cured PDMS. As shown in (h) of FIG. 6, PFBT mixed TIPS/PTAA was spun coating on OFET area and then CYTOP was spun coating as the first layer of OFET top dielectric. As shown in (i) of FIG. 6, $HfO_2$—$Al_2O_3$ nanolaminate was deposited as the second layer of OFET top dielectric and Ag was deposited as OFET top gate electrodes. The resultant device was then put through various tests. The results of these test are summarized in the graphs that follow.

Figures 7A, 7B:
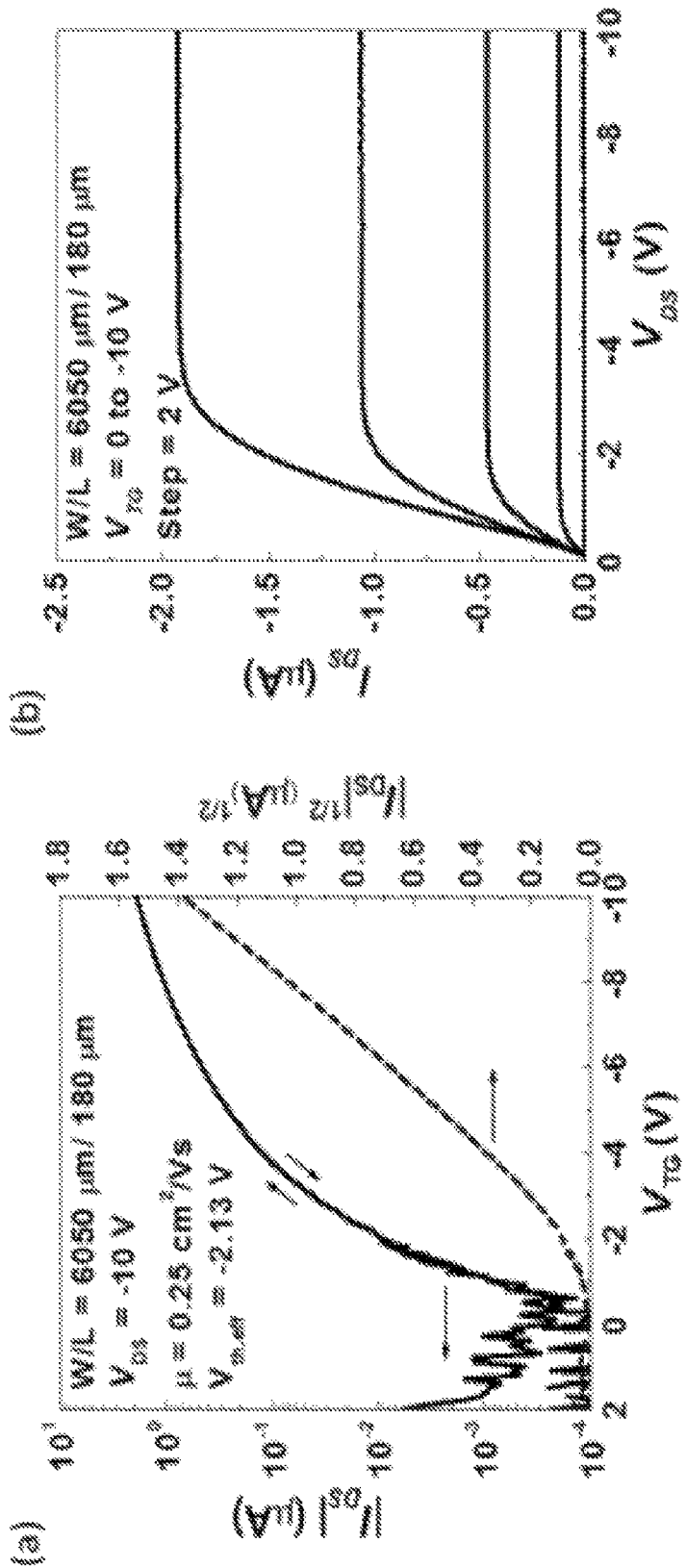
FIG. 7A is a graph depicting the transfer characteristics, in the absence of a signal, of the sensor device from FIG. 1, in accordance with an example of the present disclosure.
FIG. 7B is a graph depicting the output characteristics, in the absence of a signal, of the sensor device from FIG. 1, in accordance with an example of the present disclosure.

FIG. 7A is a graph depicting the transfer characteristics of the sensor device fabricated via the process described in FIG. 6, in accordance with an example of the present disclosure. FIG. 7B is a graph depicting the output characteristics of the sensor device fabricated via the process described in FIG. 6, in accordance with an example of the present disclosure. FIGS. 7A and 7B show the transfer and output characteristics of the DG-OFET with only top-gate controlled properties. For FIG. 7A, the transfer characteristics were measured by sweeping $V_{tg}$ from 2 to −10 V and back in order to investigate hysteresis phenomena, which as shown in the figure was found to be negligible. Based on FIG. 7B, it was clear that $I_{ds}$ is weakly dependent on $V_{ds}$ and that rather it is primarily controlled by $V_{tg}$ in the saturation region.

Figures 8A, 8B:
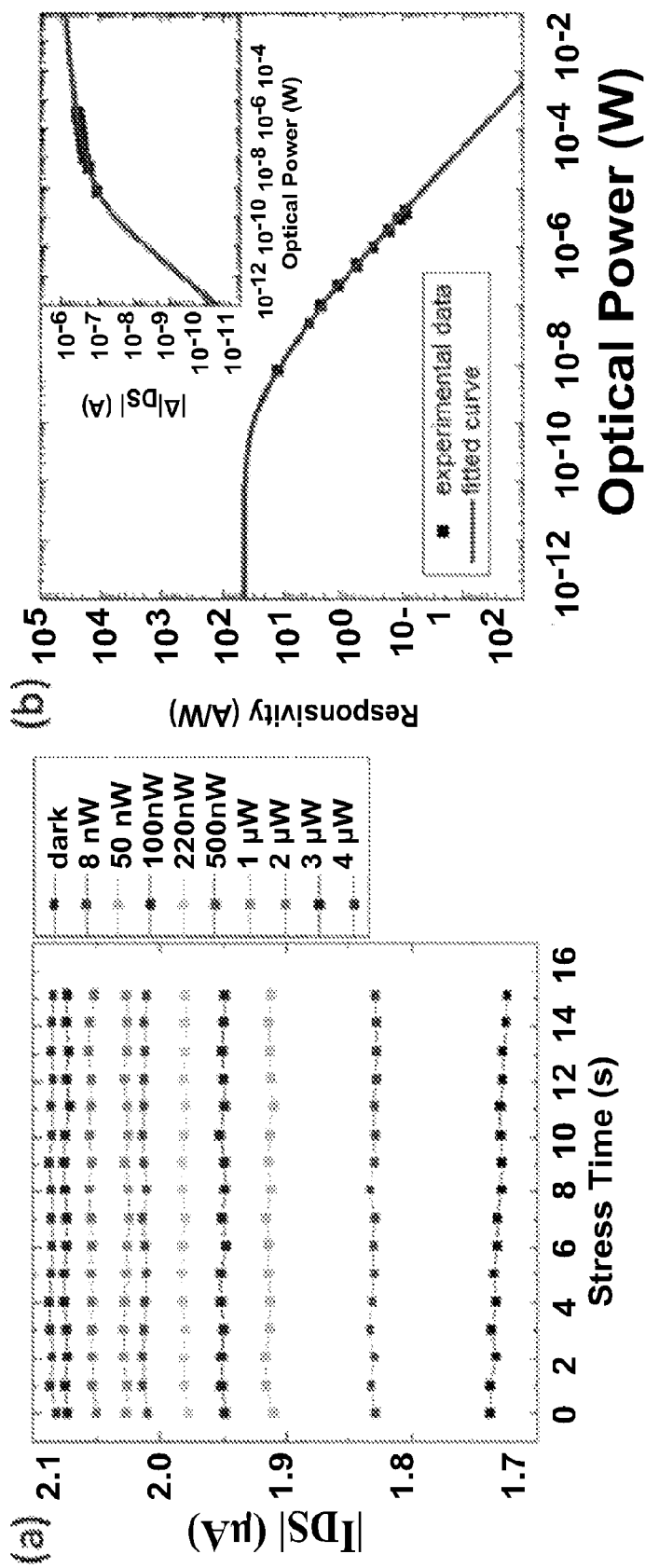
FIG. 8A is a graph depicting the temporal evolution of the sensor device from FIG. 1 in response to light of different optical powers, in accordance with an example of the present disclosure.
FIG. 8B is a graph depicting the responsivity of sensor device from FIG. 1, in accordance with an example of the present disclosure.

FIG. 8A is a graph depicting the temporal evolution of the sensor device fabricated via the process described in FIG. 6, in accordance with an example of the present disclosure. FIG. 8B is a graph depicting the responsivity of the sensor device fabricated via the process described in FIG. 6, in accordance with an example of the present disclosure. In order to generate the graphs from FIGS. 8A and 8B, a 635 nm laser sourced was used to illuminate the backside of the OPD with continuous biases of $V_{tg}$=−10 V and $V_{ds}$=−6 V. FIG. 8A compares the temporal $I_{ds}$ at continuous bias-stress test in the dark and under illumination with different incident optical power. As shown, the device shows high operational stability and little noise in all conditions. FIG. 8B compares the change in $I_{ds}$ from dark to light conditions against varying optical power. As shown, the device demonstrates high photoresponsivity reaching as large as 12 A/W at $P_{opt}=10^{-8}$ W.

Figures 9A, 9B:
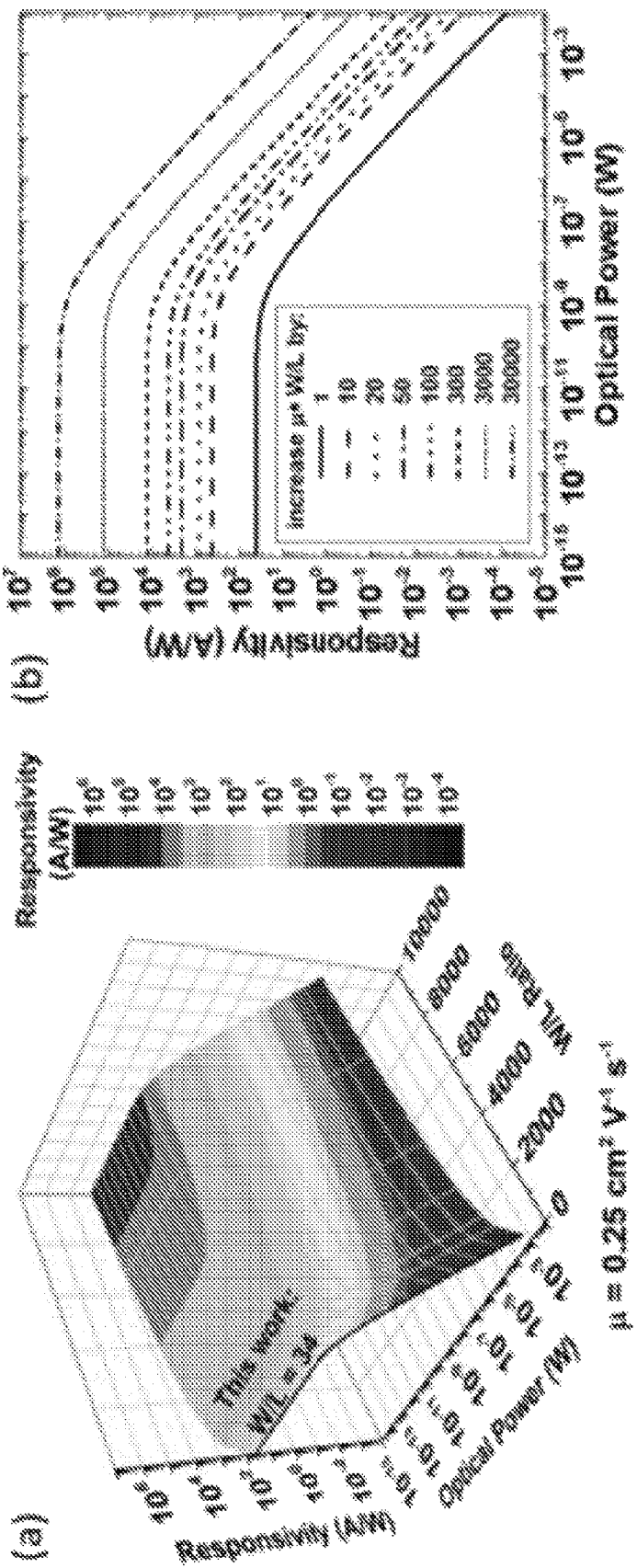
FIG. 9A is a graph depicting simulation results for the responsivity versus optical power and versus channel width to length ratio for a sensor device, in accordance with an example of the present disclosure.
FIG. 9B is a graph depicting simulation results for the responsivity versus optical power as a function of the product of the field-effect mobility times the channel width to length ratio for a sensor device, in accordance with an example of the present disclosure.
Figure 9C:
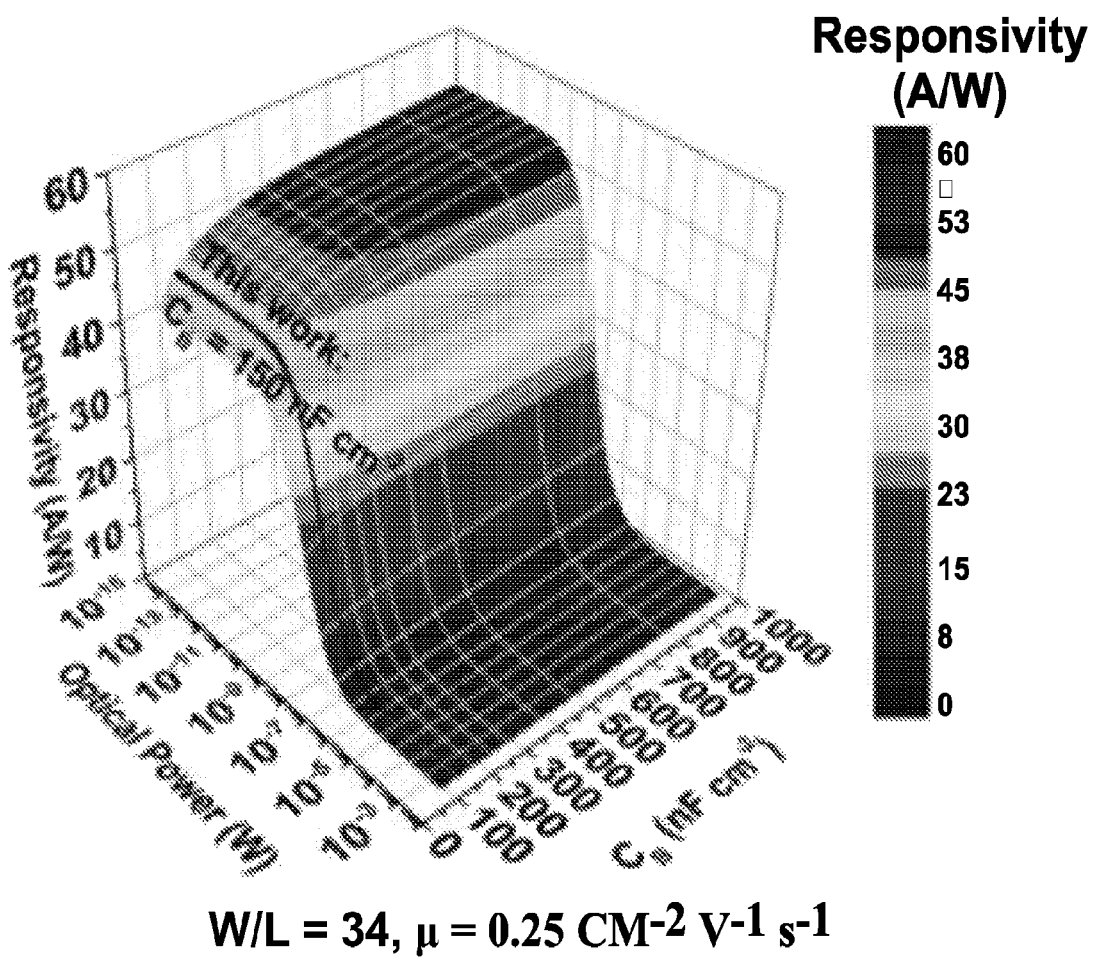
FIG. 9C is a graph depicting simulation results for the responsivity versus optical power and versus the capacitance density of the second gate insulator for a sensor device, in accordance with an example of the present disclosure.

FIGS. 9A, 9B, and 9C are graphs depicting simulation results for the responsivity versus optical power, W/L ratio and capacitance density of the second gate insulator for a photodetector device, in accordance with an example of the present disclosure. In FIG. 9A the simulation had fixed carrier mobility (μ) and varying W/L ratios. In FIG. 9B the simulation had varying μW/L values. In FIG. 9B the simulation had varying capacitance density values. As shown from the results, the responsivity rates show a relationship with μW/L and capacitance density of the second gate insulator, such that fine tuning these parameters for a given device should increase the responsivity even further.

Figure 10A:
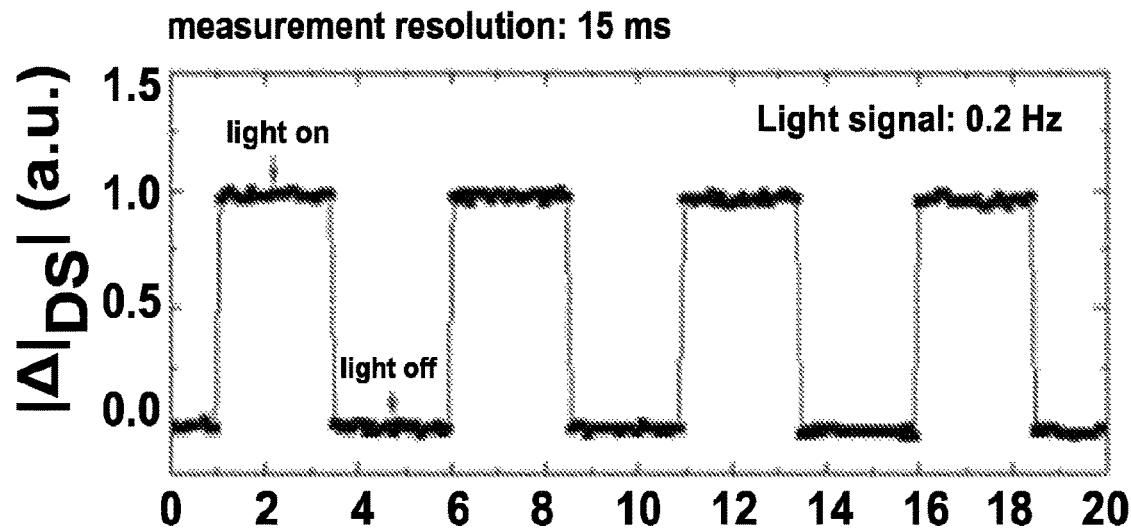
FIGS. 10A, 10B, and 10C are graphs depicting the temporal response for a sensor device, in accordance with an example of the present disclosure.
Figure 10B:
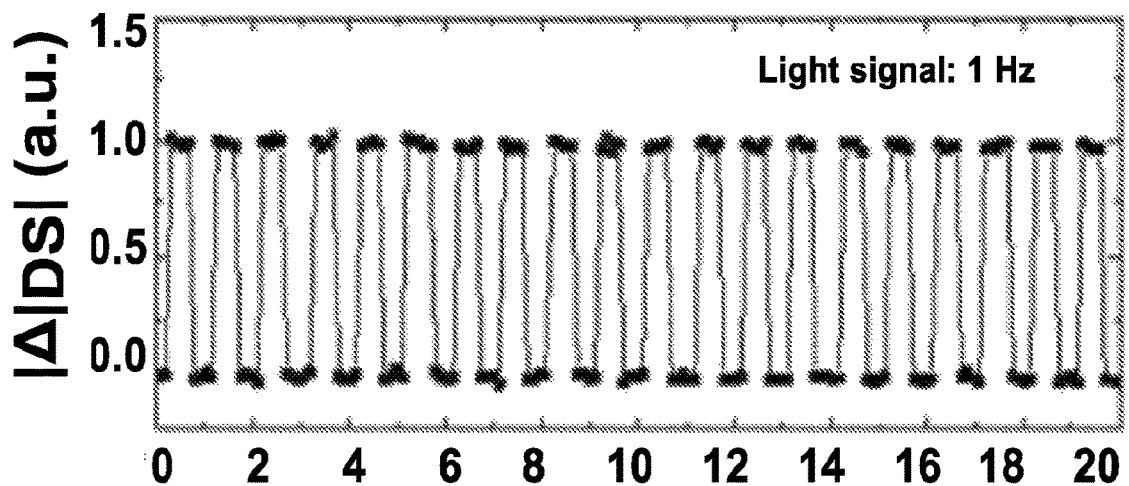
Figure 10C:
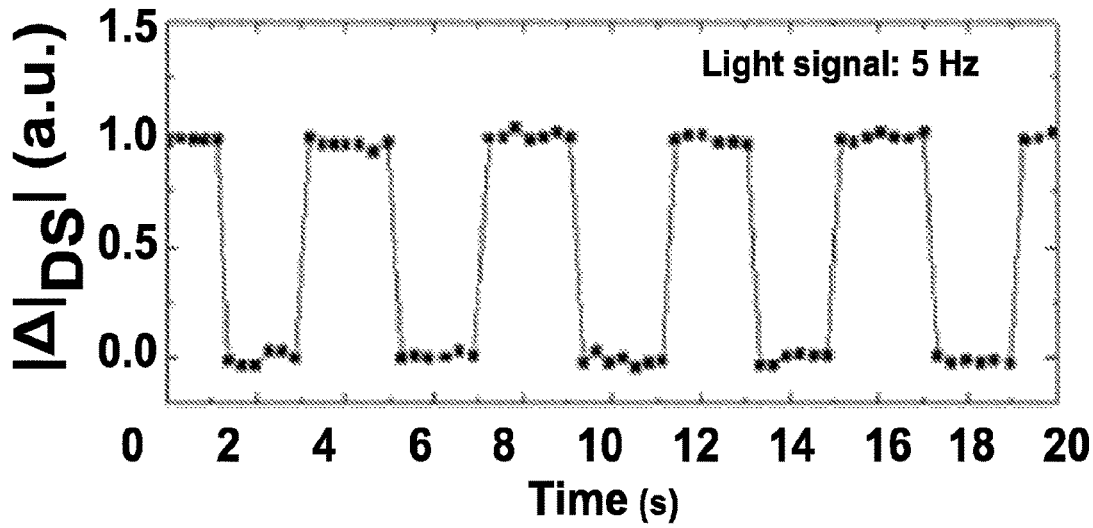

FIGS. 10A, 10B, and 10C are graphs depicting response times for a photodetector device, in accordance with an example of the present disclosure. The graphs in FIGS. 10A, 10B, and 10C show the normalized response of $I_{ds}$ changes with the OPD under radiation of a surface mounted LED at square waveform with on/off frequencies of 0.2 Hz, 1 Hz, and 5 Hz. The OFET was biased at $V_{tg}$=−10 V and $V_{ds}$=−6 V continuously with the current measurement step size of 15 ms. As shown, the rise and fall time of the $I_{ds}$ waveform is faster than the measurement resolution, which indicates that the response frequency of the OPD is no less than 100 Hz. Such measurements would be compatible with video rate requirements, indicating the device would have wide reaching uses.

What is claimed is:

1. A semiconductor device comprising:
    a field-effect transistor;
    a sensor; and
    a substrate;
    wherein the field-effect transistor comprises:
        a first gate electrode;
        a second gate electrode having a first length, a first portion and a second portion;
        a source electrode;
        a drain electrode;
        a semiconductor layer having a first side and a second side;
        a bi-layer gate insulator; and
        a second gate insulator having a second length shorter than the first length and located between the first portion of the second gate electrode and the second side of the semiconductor layer;
    wherein the sensor is located on the second portion of the second gate electrode and is in electrical communication with the second gate electrode; and
    wherein at least a portion of the second gate electrode is located between the substrate and the second gate insulator.

2. The semiconductor device of claim 1, wherein the bi-layer gate insulator comprises:
    a first layer having a first dielectric constant and a first thickness; and
    a second layer having a second dielectric constant and a second thickness;
    wherein the first layer is located between the second layer and the second side of the semiconductor layer; and
    wherein the second layer is located between the first layer and the first gate electrode.

3. The semiconductor device of claim 2, wherein at least one of:
    the first layer of the bi-layer gate insulator comprises a fluoropolymer;
    the second layer of the bi-layer gate insulator comprises a nanolaminate layer;
    the second dielectric constant is higher than the first dielectric constant;
    interfacial charge trapping at a first interface, where the first layer of the bi-layer gate insulator is positioned adjacent the first side of the semiconductor layer, causes a first effect on a current between the drain electrode and the source electrode over time under a continuous bias stress;
    a change in a polarizability of the second layer of the bi-gate insulator over time under continuous bias stress causes a second effect on the current between the drain electrode and the source electrode;
    the semiconductor layer has parts in contact with the source electrode and the drain electrode; or
    the sensor is located between the second gate electrode and the substrate.

4. The semiconductor device of claim 3, wherein selection of the first thickness and the second thickness and the first dielectric constant and the second dielectric constant are such that the first effect compensates at least partly the second effect which provides increased operational stability.

5. The semiconductor device of claim 1, wherein a variation of a current between the source electrode and the drain electrode under a continuous bias stress for a period of one hour is less than 5 percent.

6. The semiconductor device of claim 1, wherein the sensor is selected from the group consisting of a photodiode, a chemical sensor, a biological sensor, a mechanical sensor, and a device that senses an analyte or a physical parameter and converts it into an electrical signal through a transducer mechanism.

7. The semiconductor device of claim 1, wherein the sensor is located between the second gate electrode and the substrate.

8. The semiconductor device of claim 2, wherein the second gate electrode is located between the substrate and the second layer of the bi-layer gate insulator.

9. The semiconductor device of claim 1, wherein the semiconductor device is an organic semiconductor device.

10. The semiconductor device of claim 1, wherein the second gate insulator comprises aluminum oxide; and
wherein the second gate insulator is deposited by atomic layer deposition (ALD).

11. The semiconductor device of claim 1, wherein a capacitance density of the second gate insulator is between 10 and 400 nanoFarads per centimeter squared.

12. The semiconductor device of claim 1, wherein a thickness of the second gate insulator is between 10 and 50 nm.

13. The semiconductor device of claim 2, wherein the second layer of the bi-layer gate insulator comprises:
aluminum oxide; and
an inorganic material selected from the group consisting of $SiN_x$, $TiO_2$, $HfO_2$, $Ta_2O5$, $SiO_2$, $Y_2O_3$, and $ZrO_2$.

14. A semiconductor device comprising:
a field-effect transistor comprising:
a first gate electrode;
a second gate electrode having a first length, a first portion and a second portion;
a source;
a drain;
a semiconductor layer having a first side and a second side;
a bi-layer gate insulator comprising a first layer and a second layer, the first layer located between the second layer and the first side of the semiconductor layer; and
a second gate insulator having a second length shorter than the first length and located between the first portion of the second gate electrode and the second side of the semiconductor layer; and
a sensor located on the second portion of the second gate electrode and in electrical communication with the second gate electrode.

15. The semiconductor device of claim 14 further comprising a substrate;
wherein the first gate electrode is located between the substrate and the second layer of the bi-layer gate insulator; and
wherein the sensor is located between the second gate electrode and the substrate.

16. The semiconductor device of claim 14 further comprising a substrate;
wherein the second gate electrode is located between the substrate and the second gate insulator; and
wherein the sensor is located between the second gate electrode and the substrate.

17. The semiconductor device of claim 14, wherein the sensor is selected from the group consisting of a photodiode, a chemical sensor, a biological sensor, a mechanical sensor, and a device that senses an analyte or a physical parameter and converts it into an electrical signal through a transducer mechanism.

18. The semiconductor device of claim 14, wherein at least one of:
the semiconductor device is an organic semiconductor device;
the second gate insulator comprises aluminum oxide;
a capacitance density of the second gate insulator is between 10 and 400 nanoFarads per centimeter squared;
a thickness of the second gate insulator is between 10 and 50 nm; or
the second layer of the bi-layer gate insulator comprises:
aluminum oxide; and
an inorganic material selected from the group consisting of $SiN_x$, $TiO_2$, $HfO_2$, $Ta_2O5$, $SiO_2$, $Y_2O_3$, and $ZrO_2$.

19. The semiconductor device of claim 14, wherein the semiconductor layer has parts in contact with the source and drain;
wherein the second layer of the bi-layer gate insulator is located between the first layer and the first gate electrode;
wherein the first layer of the bi-layer gate insulator is positioned adjacent the first side of the semiconductor layer at a first interface;
wherein the first layer of the bi-layer gate insulator comprises a fluoropolymer;
wherein the first layer of the bi-layer gate insulator has a first dielectric constant and a first thickness;
wherein interfacial charge trapping at the first interface causes a first effect on a current between the drain and the source over time under a continuous bias stress;
wherein the second layer of the bi-layer gate insulator comprises a nanolaminate layer;
wherein the second layer of the bi-layer gate insulator has a second dielectric constant and a second thickness, the second dielectric constant being higher than the first dielectric constant; and
wherein a change in a polarizability of the second layer of the bi-gate insulator over time under continuous bias stress causes a second effect on the current between the drain and the source.

20. A method for manufacturing the semiconductor device of claim 1 comprising:
patterning the first length of the second gate electrode on the substrate;
depositing the second length of the second gate insulator on the first portion of the second gate electrode;
spin coating the semiconductor layer on at least a portion of the second gate insulator;
spin coating a first layer of the bi-layer gate insulator on the first side of the semiconductor layer;
depositing a second layer of the bi-layer gate insulator on the first layer of the bi-layer gate insulator;
depositing the first gate electrode on the second layer of the bi-layer gate insulator; and
electrically communicating the sensor with the second portion of the second gate electrode;
wherein the first layer of the bi-layer gate insulator comprises a fluoropolymer, has a first dielectric constant, and has a first thickness;
wherein the second layer of the bi-layer gate insulator has a second dielectric constant, and has a second thickness; and
wherein the second dielectric constant is higher than the first dielectric constant.

21. The method of claim 20 further comprising depositing the source electrode and the drain electrode on a portion of the second gate insulator;
wherein the semiconductor layer is spin coated on a remaining portion of the second gate insulator;
wherein the first layer of the bi-layer gate insulator defines an interface with the semiconductor layer;
wherein spin coating the first layer of the bi-layer gate insulator is such that interfacial charge trapping at the interface causes a first effect on a current between the source and drain over time under a continuous bias stress;

wherein a change in a polarizability of the bi-layer gate insulator over time under continuous bias stress causes a second effect on the current between the drain and the source; and wherein selection of the first thickness and the second thickness and the first dielectric constant and the second dielectric constant are such that the first effect compensates at least partly the second effect.

22. The method of claim 21, wherein a capacitance density of the second gate insulator is between 10 and 400 nanoFarads per centimeter squared; and wherein the sensor is located between the second gate electrode and the substrate.

* * * * *